United States Patent
Yeh et al.

(10) Patent No.: US 8,692,280 B2
(45) Date of Patent: Apr. 8, 2014

(54) OPTOELECTRONIC SEMICONDUCTOR DEVICE

(75) Inventors: Shi-Liang Yeh, Hsinchu (TW); Shih-Chiang Yeh, legal representative, Taoyuan County (TW); Chien-Yuan Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 31 days.

(21) Appl. No.: 13/207,924

(22) Filed: Aug. 11, 2011

(65) Prior Publication Data

US 2012/0032198 A1    Feb. 9, 2012

Related U.S. Application Data

(63) Continuation-in-part of application No. 12/591,617, filed on Nov. 25, 2009, now Pat. No. 8,274,156.

(51) Int. Cl.
H01L 33/00    (2010.01)

(52) U.S. Cl.
USPC ............ 257/99; 257/776; 257/E33.062

(58) Field of Classification Search
USPC .......... 257/773, 776, E33.001, E33.062, 257/E33.065, E31.001, E31.124, E23.143, 257/E23.169, E23.151, E23.152, E23.17, 257/E23.175, 79–103, 414, 428–466; 438/106, 666
See application file for complete search history.

(56) References Cited

U.S. PATENT DOCUMENTS

| | | | |
|---|---|---|---|
| 5,977,565 A * | 11/1999 | Ishikawa et al. | 257/81 |
| 6,307,218 B1 | 10/2001 | Steigerwald et al. | |
| 6,445,007 B1 | 9/2002 | Wu et al. | |
| 6,642,548 B1 | 11/2003 | Brown et al. | |
| 6,822,437 B1 * | 11/2004 | Hau-Riege et al. | 324/762.03 |
| 7,679,097 B2 | 3/2010 | Akaishi | |
| 2004/0012030 A1 * | 1/2004 | Chen et al. | 257/99 |
| 2008/0230791 A1 * | 9/2008 | Lin et al. | 257/91 |
| 2008/0251808 A1 * | 10/2008 | Kususe et al. | 257/98 |
| 2008/0315240 A1 | 12/2008 | Kim et al. | |
| 2009/0008668 A1 | 1/2009 | Matsumura | |
| 2009/0039359 A1 * | 2/2009 | Yoon et al. | 257/88 |
| 2009/0179217 A1 | 7/2009 | Xuan et al. | |
| 2010/0187559 A1 * | 7/2010 | Han | 257/99 |

* cited by examiner

*Primary Examiner* — Fernando L Toledo
*Assistant Examiner* — Victoria K Hall
(74) *Attorney, Agent, or Firm* — Muncy, Geissler, Olds & Lowe, P.C.

(57) ABSTRACT

An optoelectronic semiconductor device including: a substrate; a semiconductor system having an active layer formed on the substrate; and an electrode structure formed on the semiconductor system, wherein the electrode structure includes: a first conductivity type bonding pad; a second conductivity type bonding pad; a first conductivity type extension electrode; and a second conductivity type extension electrode, wherein the first conductivity type extension electrode and the second conductivity type extension electrode form a three-dimensional crossover; wherein the first conductivity type extension electrode and the second conductivity type extension electrode are on the opposite sides of the active layer.

17 Claims, 9 Drawing Sheets

OPTOELECTRONIC SEMICONDUCTOR DEVICE

REFERENCE TO RELATED APPLICATION

This application is a continuation-in-part of U.S. patent application Ser. No. 12/591,617, entitled "OPTOELECTRONIC SEMICONDUCTOR DEVICE", filed on Nov. 25, 2009, now U.S. Pat. No. 8,274,156, the entire contents of which are incorporated herein by reference, which claims the right of priority to TW application Ser. No. 097146075, filed on Nov. 26, 2008, entitled "OPTOELECTRONIC SEMICONDUCTOR DEVICE."

BACKGROUND

1. Technical Field

An optoelectronic semiconductor device is disclosed, especially related to a layout of an electrode structure of the optoelectronic semiconductor device.

2. Description of the Related Art

The current crowding effect refers to an uneven distribution of current density occurred commonly in conventional light emitting devices. It accumulates heat locally in the lighting device and decreases the lighting efficiency. For the worse case, it damages the lighting device.

The layout of the electrode structure of the light emitting device is for the purpose of spreading the current driving into the semiconductor layer more evenly and solving the issue of current crowding. The key factors for consideration are the distance of the p-type electrode and the n-type electrode, and the positions of the pads and the fingers. However, as the chip size and the driving voltage of the light emitting devise increases, the current flow to the end side of the finger is influenced by the accumulated resistance and therefore is not spread uniformly.

The layout of the electrode structure of the vertical type chip has the n-type electrode and the p-type electrode positioned in the opposite sides of the chip. But in this design, the epitaxial substrate needs to be removed to expose the first conductivity type semiconductor layer connected to the substrate so the first electrode can be formed on the exposed surface. Besides, a reflecting layer, a second electrode and a permanent substrate are formed on the second conductivity type semiconductor layer of the surface of the epitaxial structure. The process is complicated so it is difficult to maintain the yield and the cost is high.

SUMMARY

An optoelectronic semiconductor device including: a substrate; a semiconductor system having an active layer formed on the substrate; and an electrode structure formed on the semiconductor system, wherein the electrode structure includes: a first conductivity type bonding pad; a second conductivity type bonding pad; a first conductivity type extension electrode; and a second conductivity type extension electrode wherein the first conductivity type extension electrode and the second conductivity type extension electrode form a three-dimensional crossover; wherein the first conductivity type extension electrode and the second conductivity type extension electrode are on the opposite sides of the active layer.

With the three-dimensional crossover arrangement, the design of the electrodes of different conductivity types in the light emitting diode (including the bonding pads and the extension electrodes) is more flexible, and its manufacturing process is more stable with low cost.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
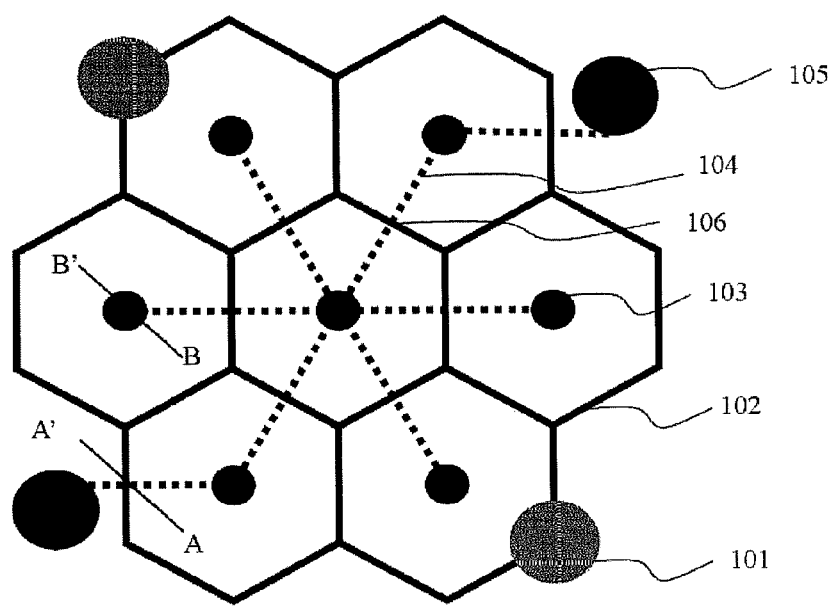
FIG. 1 illustrates a top view of the electrode structure of the optoelectronic semiconductor device in accordance with the first embodiment of the present application.

Reference is made in detail to the preferred embodiments of the present application, examples of which are illustrated in the accompanying drawings. Wherever possible, the same reference numbers are used in the drawings and the description to refer to the same or like parts.

FIG. 1 shows a top view of the electrode structure of the optoelectronic semiconductor device in accordance with the first embodiment of the present application. The device includes at least a p-type bonding pad 101, a plurality of p-type extension electrodes 102, a plurality of n-type contact zones 103, a plurality of n-type extension electrodes 104 and at least an n-type bonding pad 105. The p-type extension electrodes 102 form a plurality of symmetrical closed patterns, and at least a p-type bonding pad 101 is formed on the p-type extension electrodes 102. The n-type contact zone 103 is disposed in the symmetrical closed pattern mentioned above and electrically connected to the plurality of n-type extension electrodes 104. Besides, the p-type extension electrodes 102 and the n-type extension electrodes 104 are electrically connected to the p-type bonding pad 101 and the n-type bonding pad 105 respectively. In this embodiment, the p-type extension electrodes 102 and the n-type extension electrodes 104 are separated by an insulating layer at the three-dimensional crossover 106. The material of the electrode structure mentioned above can be metal material such as Cr, Ti, Ni, Pt, Cu, Au, Al, or Ag.

The first embodiment is described hereinafter in accompany with drawings FIG. 1, FIG. 2A and FIG. 2B. An optoelectronic semiconductor device includes a semiconductor system formed on a substrate 201 and an electrode structure formed on the semiconductor system. A semiconductor system is referred as a semiconductor device, equipment, product, circuit, or application that can proceed or induce the light energy and electrical energy transfer. Specifically speaking, a semiconductor system includes a light-emitting diode (LED), a laser diode (LD), a solar cell, a liquid crystal display, or an organic light-emitting diode. The phrase "semiconductor system" in the specification does not require that all the subsystems or units in the system are semiconductor materials. Other non-semiconductor materials such as metal, oxide, insulator and so on can also be optionally integrated in the semiconductor system.

In accordance with the first embodiment in the application, a semiconductor system includes at least a first conductivity type layer 202, an active layer 203, and a second conductivity type layer 204. The first conductivity type layer 202 and the second conductivity type layer 204 are two single-layer structures or two multiple layers structure ("multiple layers" means two or more than two layers) having different electrical properties, polarities, dopants for providing electrons or holes respectively. If the first conductivity type layer 202 and the second conductivity type layer 204 are composed of the semiconductor materials, and the conductivity type can be any two of p-type, n-type, and i-type. The active layer 203 disposed between the first conductivity type layer 202 and the second conductivity type layer 204 is a region where the light energy and the electrical energy could transfer or could be induced to transfer. The device transferring the electrical energy to the light energy can be a light-emitting diode, a liquid crystal display, or an organic light-emitting diode; the device transferring the light energy to the electrical energy can be a solar cell or an optoelectronic diode.

Taking the light-emitting diode as an example, the light emission spectrum after transformation can be adjusted by changing the physical or chemical arrangement of one layer or more layers in the semiconductor system. The materials commonly used are aluminum gallium indium phosphide (AlGaInP) series material, aluminum gallium indium nitride (AlGaInN) series material, zinc oxide (ZnO) series material and so on. The active layer 203 can be a single heterostructure (SH), a double heterostructure (DH), a double-side double heterostructure (DDH), or a multi-quantum well (MWQ). Besides, the wavelength of the emitting light can also be adjusted by changing the number of the pairs of the quantum well.

The substrate 201 is used for growing or carrying the semiconductor system, and the suitable material includes but is not limited to germanium (Ge), gallium arsenide (GaAs), indium phosphide (InP), sapphire, silicon carbide (SiC), silicon (Si), lithium aluminum oxide (LiAlO$_2$), zinc oxide (ZnO), gallium nitride (GaN), aluminum nitride (AlN), glass, composite material, diamond, CVD diamond, diamond-like carbon (DLC) and so on.

A transition layer (not shown) is optionally formed between the substrate 201 and the semiconductor system. The transition layer is disposed between two material systems to transit a material system like the substrate to another material system like the semiconductor material system. For the light-emitting diode structure, on one hand, the transition layer can be a layer like the buffer layer to reduce the lattice mismatch between two material systems. On the other hand, the transition layer can also be a single layer, multiple layers, or a structure to combine two materials or two separated structures where the material can be organic, inorganic, metal, semiconductor and so on, and the structure can be a reflective layer, a heat conducting layer, an electrical conducting layer, an ohmic contact layer, an anti-deformation layer, a stress release layer, a stress adjustment layer, a bonding layer, a wavelength converting layer, a mechanical fixing structure and so on.

A contact layer (not shown) can also be optionally formed on the second conductivity layer 204. The contact layer is disposed on the side of the second conductivity layer 204 away from the active layer 203. Specifically speaking, the contact layer could be an optical layer, an electrical layer or the combination of the two. An optical layer can change the electromagnetic radiation or the light from or entering the active layer 203. The term "change" here means to change at least one optical property of the electromagnetic radiation or the light. The abovementioned property includes but is not limited to frequency, wavelength, intensity, flux, efficiency, color temperature, rendering index, light field, and angle of view. An electrical layer can change or be induced to change the value, density, or distribution of at least one of the voltage, resistance, current, or capacitance between any pair of the opposite sides of the contact layer. The composition material of the contact layer includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is about 0.005 μm~0.6 μm.

The second conductivity layer 204 and the active layer 203 are etched to expose a portion of the discontinuous first conductivity type layer 202. An insulating layer 205 is formed on a specific region of the second conductivity layer 204 to avoid short when an n-type contact zone 208 formed in the following process directly contacts with the second conductivity layer 204 and the active layer 203. Afterwards, according to the layout design of the electrode structure, the positions of the n-type contact zone 208, a p-type extension electrode 206 and a p-type bonding pad (not shown) are defined by lithography, and metal material is formed on the defined area mentioned above by evaporation or electroplating to form the n-type contact zone 208, the p-type extension electrode 206 and the p-type bonding pad (not shown).

Next, the insulating layer 205 covers the surface of the device with high dielectric constant material like inorganic oxide or dielectric organic material such as $SiO_x$, $SiN_x$, $Al_2O_3$, $TiO_x$. The n-type contact zone 208 and the p-type bonding pad (not shown) are exposed by lithography and etching process. Finally, the n-type bonding pad and the n-type extension electrode 207 are defined by lithography and metal material formed on the defined area mentioned above by evaporation or electroplating to form the n-type bonding pad and the n-type extension electrode 207 to complete the three-dimensional crossover electrode design of this application.

Figure 2A:
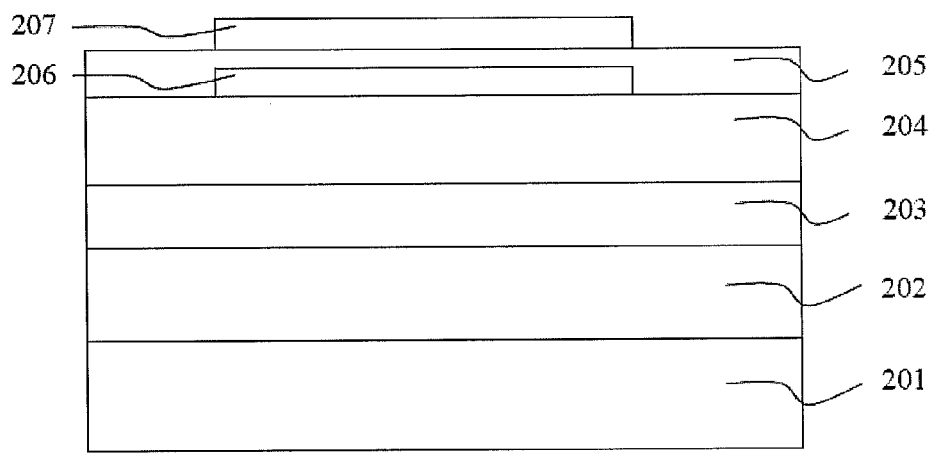
FIG. 2A illustrates a cross-sectional view of the crossover (A-A') of the p-type extension electrode and the n-type extension electrode of the optoelectronic semiconductor device in accordance with the first embodiment of the present application.

FIG. 2A illustrates a cross-sectional view of the crossover (A-A') of the p-type extension electrode 102 and the n-type extension electrode 104 of the optoelectronic semiconductor device in accordance with the first embodiment of the present application. The p-type extension electrode 206 is formed on the second conductivity type layer 204, and an insulating layer 205 is formed on the p-type extension electrode 206 and the second conductivity type layer 204. Finally, the n-type extension electrode 207 is formed on the insulating layer 205 and is electrically insulated from the p-type extension electrode 206. The three-dimensional crossover design of the electrode structure is formed accordingly.

Figure 2B:
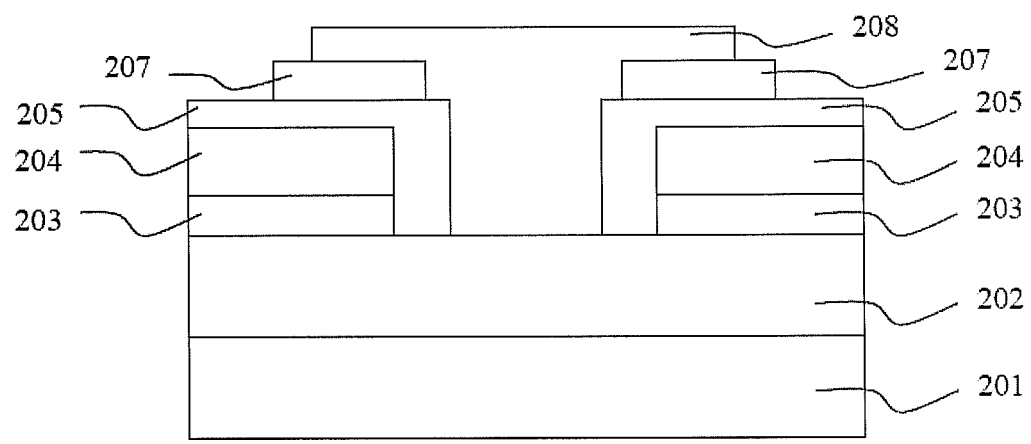
FIG. 2B illustrates a cross-sectional view of the n-type contact zone (B-B') of the optoelectronic semiconductor device in accordance with the first embodiment of the present application.

FIG. 2B illustrates a cross-sectional view of the n-type contact zone (B-B') of the optoelectronic semiconductor device in accordance with the first embodiment of the present application. After the insulating layer 205 is formed to cover the second conductivity type layer 204 and the active layer 203 mentioned above, an n-type extension electrode 207 is formed on the insulating layer 205 and is electrically insulated from the second conductivity type layer 204, and the n-type contact zone is formed with metal material. The metal material of the n-type contact zone 208 directly contacts with the first conductivity type layer 202, and the n-type extension electrode is formed on the active layer 203.

Figure 3:
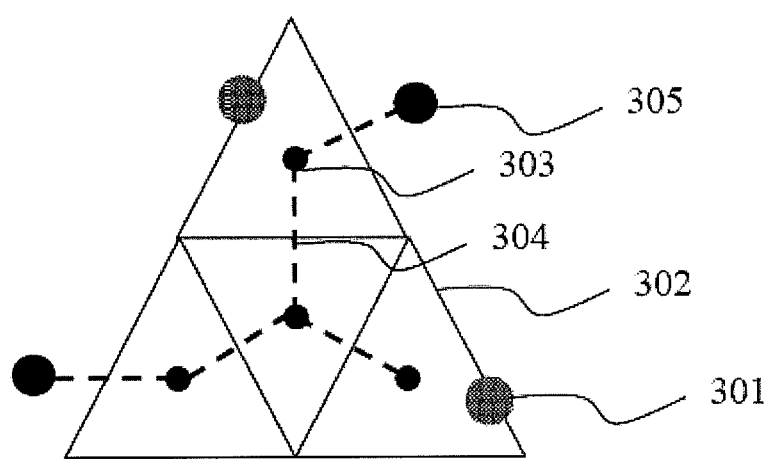
FIG. 3 illustrates a top view of the electrode structure of the optoelectronic semiconductor device in accordance with the second embodiment of the present application.
Figure 4:
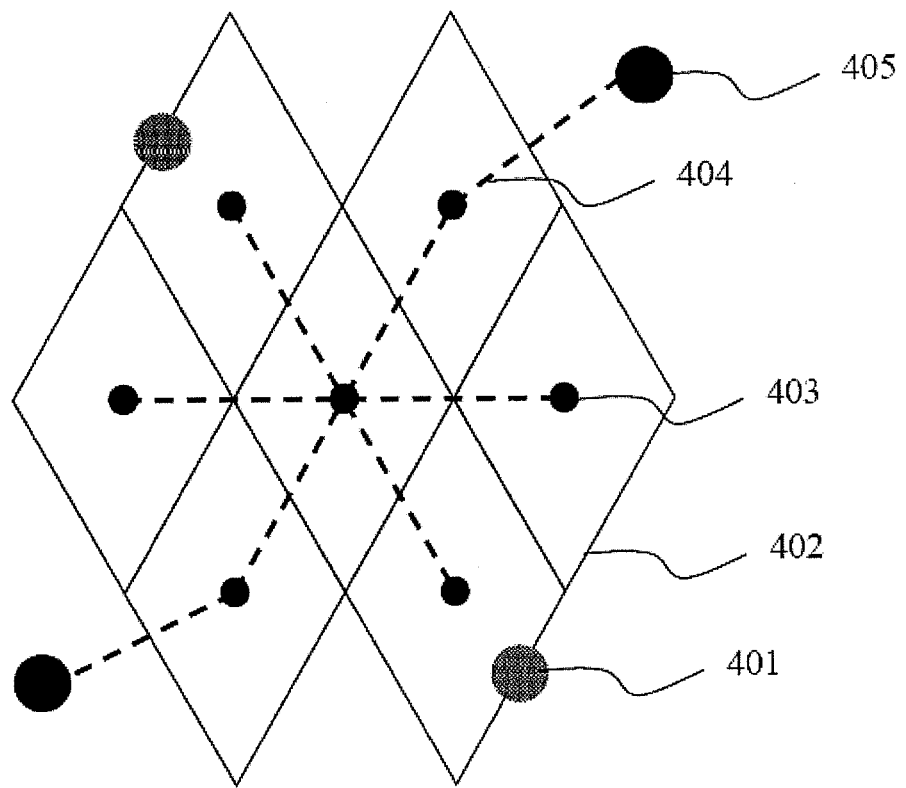
FIG. 4 illustrates a top view of the electrode structure of the optoelectronic semiconductor device in accordance with the third embodiment of the present application.

FIG. 3 and FIG. 4 illustrate top views of the layout of the electrode structure of the optoelectronic semiconductor device in accordance with the second and the third embodiments of the present application. The device shown in the drawings includes at least one p-type bonding pad 301, 401; a plurality of p-type extension electrodes 302, 402; a plurality of n-type contact zones 303, 403; a plurality of n-type extension electrodes 304, 404 and at least one n-type bonding pad 305, 405 wherein the p-type extension electrode 302, 402 forms a plurality of symmetrical closed patterns, and the n-type contact zones 303, 403 are formed in the symmetrical closed pattern mentioned above and electrically connected to each other by a plurality of n-type extension electrode 304, 404. Besides, the p-type extension electrodes 302, 402 and the n-type extension electrodes 304, 404 are electrically connected to the p-type bonding pads 301, 401 and the n-type bonding pads 305, 405 respectively. In this embodiment, the crossover of the p-type extension electrodes 302, 402 and the n-type extension electrodes 304, 404 are separated by the insulating layer to form a three-dimensional design for the electrode structure of this application.

Figure 5:
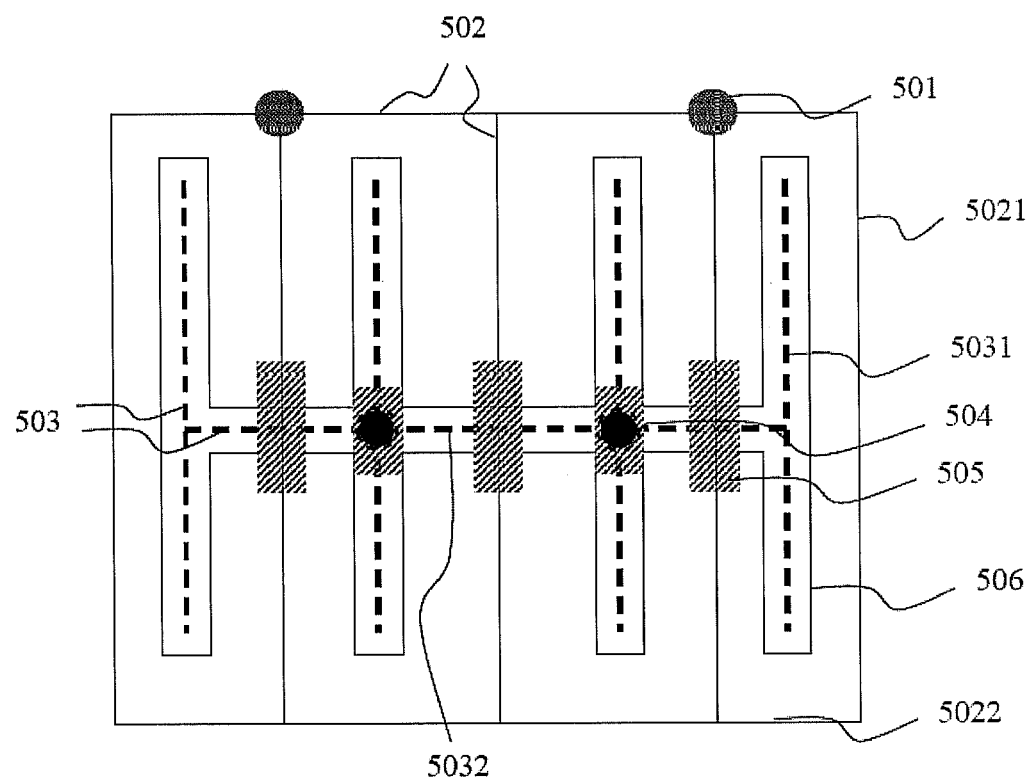
FIG. 5 illustrates a top view of the electrode structure of the optoelectronic semiconductor device in accordance with the fourth embodiment of the present application.
Figure 6:
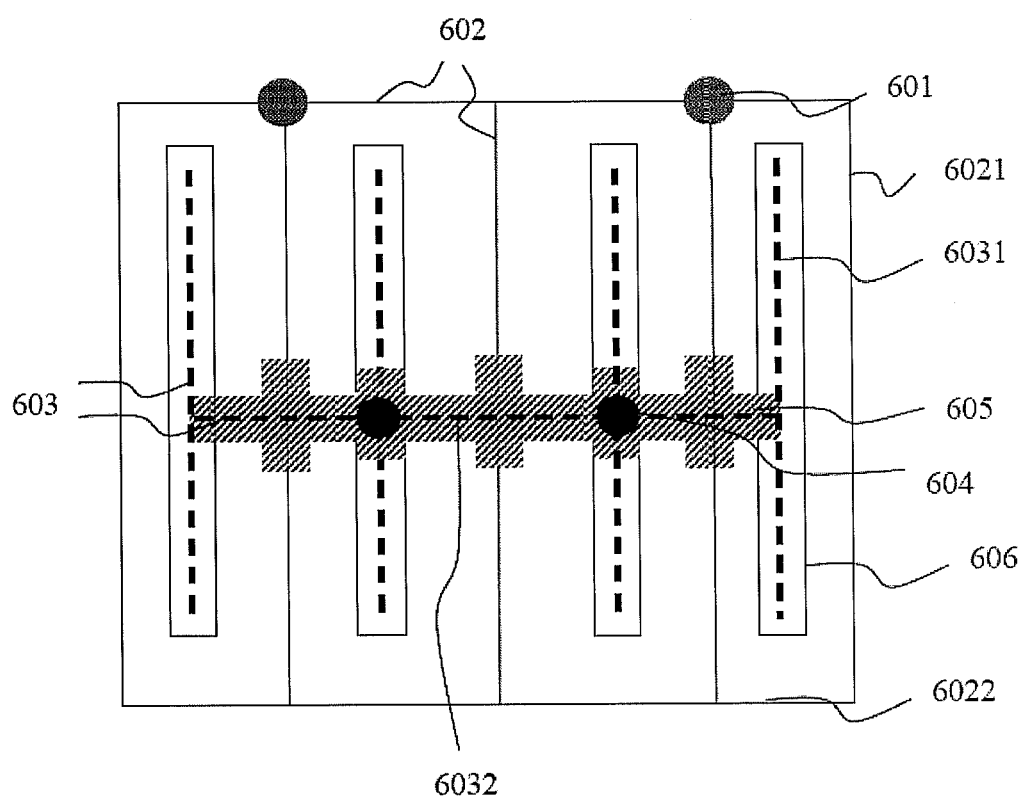
FIG. 6 illustrates a top view of the electrode structure of the optoelectronic semiconductor device in accordance with the fifth embodiment of the present application.

FIG. 5 and FIG. 6 illustrate another layout of the electrode structure of the optoelectronic semiconductor device of the present application. FIG. 5 illustrates a top view of the layout of the electrode structure of the optoelectronic semiconductor device in accordance with the fourth embodiment of the present application. The device shown in the drawing including at least one p-type bonding pad 501, a plurality of p-type extension electrodes 502, a plurality of n-type extension electrodes 503, at least an n-type bonding pad 504 and a plurality of insulating layers 505.

The p-type extension electrode 502 includes a plurality of perpendicular p-type extension electrodes 5021 and a plurality of lateral p-type extension electrodes 5022 to form a plurality of symmetrical closed patterns. A plurality of straight n-type extension electrodes 5031 and a plurality of lateral n-type extension electrodes 5032 are formed at the p-type extension electrodes 502 wherein part of the perpendicular p-type extension electrode 5021 and the lateral n-type extension electrode 5032 form the three-dimensional crossover. At least a p-type bonding pad is formed on the crossover of the perpendicular p-type extension electrode 5021 and the lateral p-type extension electrode 5022.

In this embodiment, the perpendicular n-type extension electrodes 5031 and the lateral n-type extension electrodes 5032 are formed in a trench 506 (represented by the line around the n-type extension electrodes in the FIG. 5 and FIG. 6) formed by etching the second conductivity type layer and the active layer to expose a portion of the first conductivity type layer so the n-type extension electrodes 503 are electrically connected to the first conductivity type layer. The detailed process is substantially the same with the first embodiment and can be referred thereto.

After the trench of the lateral n-type extension electrode 5032 is formed, the insulating layer 505 is formed at the crossover of the perpendicular p-type extension electrode 5021 and the lateral n-type extension electrode 5032. The perpendicular p-type extension electrode 5021 is then formed on the insulating layer 505 to form the three-dimensional crossover for two different conductivity type electrodes.

At least one n-type bonding pad 504 is formed on the crossover of the perpendicular n-type extension electrode 5031 and the lateral n-type extension electrode 5032. The n-type bonding pad 504 is disposed on the active layer by forming the insulating layer 505 on the trench 506 of the n-type extension electrode 503. The n-type bonding pad 504 is electrically connected to the n-type extension electrode 503 on the insulating layer through the wire (not shown).

FIG. 6 illustrates a top view of the layout of the electrode structure of the optoelectronic semiconductor device in accordance with the fifth embodiment of the present application. The embodiment includes at least one p-type bonding pad 601, a plurality of p-type extension electrodes 602, a plurality of n-type extension electrodes 603, at least one n-type bonding pad 604 and at least one lateral insulating layer 605.

The p-type extension electrode 602 forms a plurality of symmetrical closed patterns including a plurality of perpendicular p-type extension electrodes 6021 and a plurality of lateral p-type extension electrodes 6022. A plurality of perpendicular n-type extension electrodes 6031 and a plurality of lateral n-type extension electrodes 6032 are formed in the p-type extension electrode 602 wherein a portion of the perpendicular p-type extension electrode 6021 and the lateral n-type extension electrode 6032 form the three-dimensional crossover. At least one p-type bonding pad 601 is formed on the crossover of the p-type extension electrode 6021 and the lateral p-type extension electrode 6022.

In this embodiment, the perpendicular n-type extension electrode 6031 is formed in a trench 606 (represented by the line around the n-type extension electrode in the FIG. 5 and FIG. 6) by etching the second conductivity type layer and the active layer to expose a portion of the first conductivity type layer so the n-type extension electrodes 603 are electrically connected to the first conductivity type layer. The detailed process is substantially the same with the first embodiment and can be referred thereto.

After the trench of the perpendicular n-type extension electrode 6031 is formed, the lateral insulating layer 605 is formed at the crossover of the perpendicular p-type extension electrode 6021 and the later formed lateral n-type extension electrode 6032. The lateral n-type extension electrode 6032 is electrically connected to the perpendicular n-type extension electrode 6031 wherein the lateral n-type extension electrode 6032 and the perpendicular p-type extension electrode 6021 are formed on the lateral insulating layer 605 to form the three-dimensional crossover for two different conductivity type electrodes.

At least one n-type bonding pad 604 is formed on the crossover of the perpendicular n-type extension electrode 6031 and the lateral n-type extension electrode 6032, and is electrically connected to the lateral n-type extension electrode 6032. Instead of forming a trench, the n-type bonding pad 604 is exposed for wiring. In other embodiments, the n-type bonding pad 604 can be formed in the trench and electrically connected to the first conductivity layer and other wires directly.

Figure 7A:
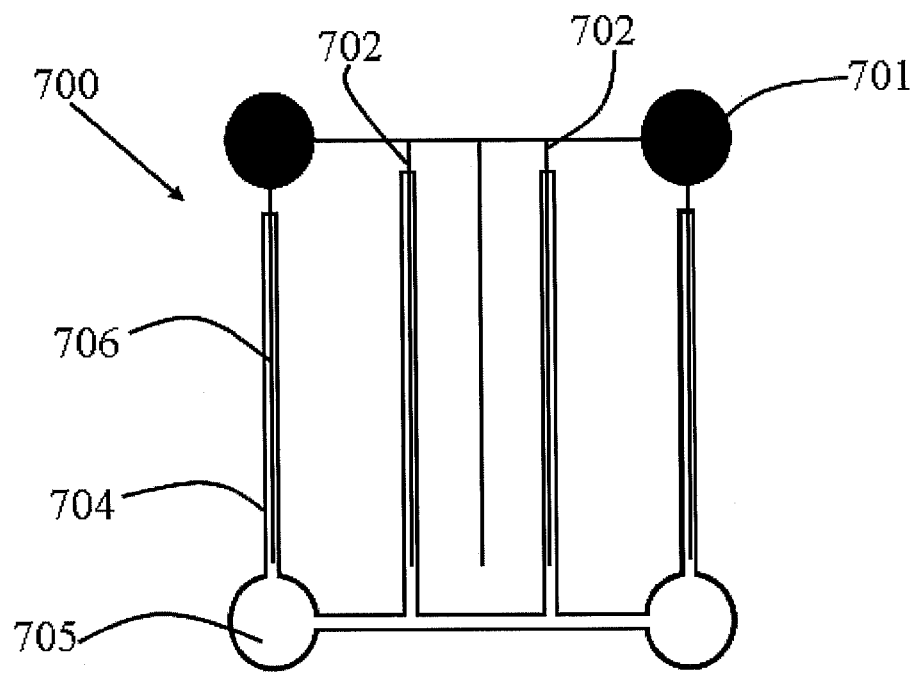
FIG. 7A illustrates a top view of the electrode structure of the optoelectronic semiconductor device in accordance with the sixth embodiment of the present application.
Figure 7B:
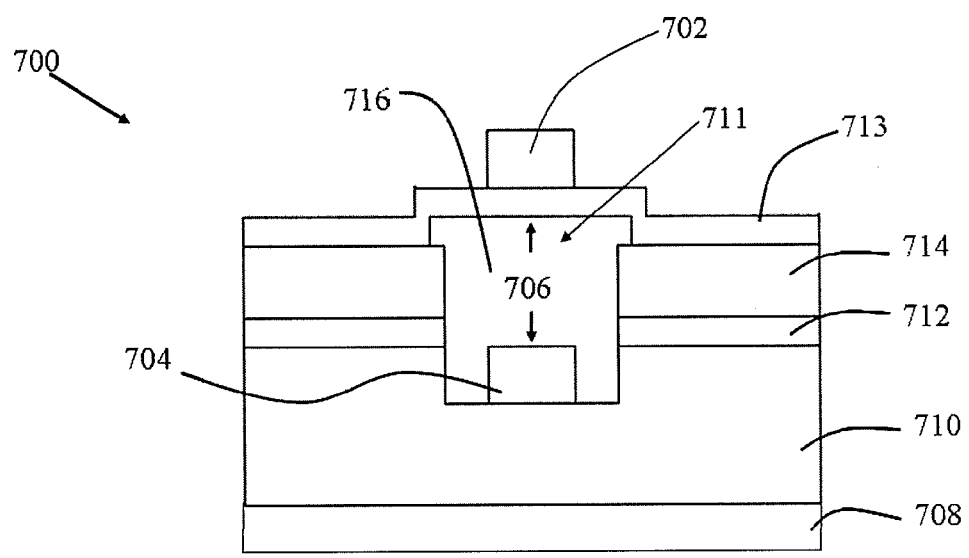
FIG. 7B illustrates a side view of the electrode structure of the optoelectronic semiconductor device in accordance with the sixth embodiment of the present application.

FIG. 7A illustrates a top view of the optoelectronic semiconductor device 700 in accordance with the sixth embodiment of the present application. The optoelectronic semiconductor device 700 includes at least a p-type bonding pad 701, a p-type extension electrode 702, a n-type extension electrode 704, and at least an n-type bonding pad 705. The p-type extension electrode 702 and the n-type extension electrode 704 include multiple-branches respectively. Besides, the p-type extension electrode 702 and the n-type extension electrode 704 is electrically connected to the p-type bonding pad 701 and the n-type bonding pad 705 respectively. In this embodiment, the p-type extension electrode 702 and the n-type extension electrode 704 is separated by an insulating layer (not shown) at the three-dimensional crossover 706. Referring to FIG. 7B, the optoelectronic semiconductor device 700 includes a substrate 708, an n-type semiconductor layer 710 formed on the substrate 708, an active layer 712 formed on the n-type semiconductor layer 710 and a p-type semiconductor layer 714 formed on the active layer 712. The p-type extension electrode 702 is electrically connected to the p-type semiconductor layer 714 and on a first side of the active layer 712, and the n-type extension electrode 704 is electrically connected to the n-type semiconductor layer 710 and on a second side of the active layer 712. A recess structure 711 is formed by removing a portion of the p-type semiconductor layer 714 and active layer 712 to expose a portion area of the n-type semiconductor layer 710, and the n-type extension electrode 704 is formed in the recess structure 711 and electrically connected to the n-type semiconductor layer 710. An insulating layer 716 is formed in the recess structure 711 and covers the n-type extension electrode 704, and a portion of the insulating layer 716 composed of the aforementioned crossover 706 is between the n-type extension electrodes 704 and, the p-type extension electrodes 702. Each of the p-type extension electrodes 702 overlaps each of the n-type extension electrodes 704 to allow more light-emitting area of the active layer 712. A transparent conductive layer 713 can be formed on the p-type semiconductor layer 714 and the insulating layer 716. The difference between the present embodiment and the aforementioned embodiments is that the n-type extension electrodes 704 are located on the n-type semiconductor layer 710 and embedded in the insulating layer 716, and the p-type extension electrodes 702 and the n-type extension electrode 704 are disposed on opposite sides of the active layer 712.

Figure 7C:
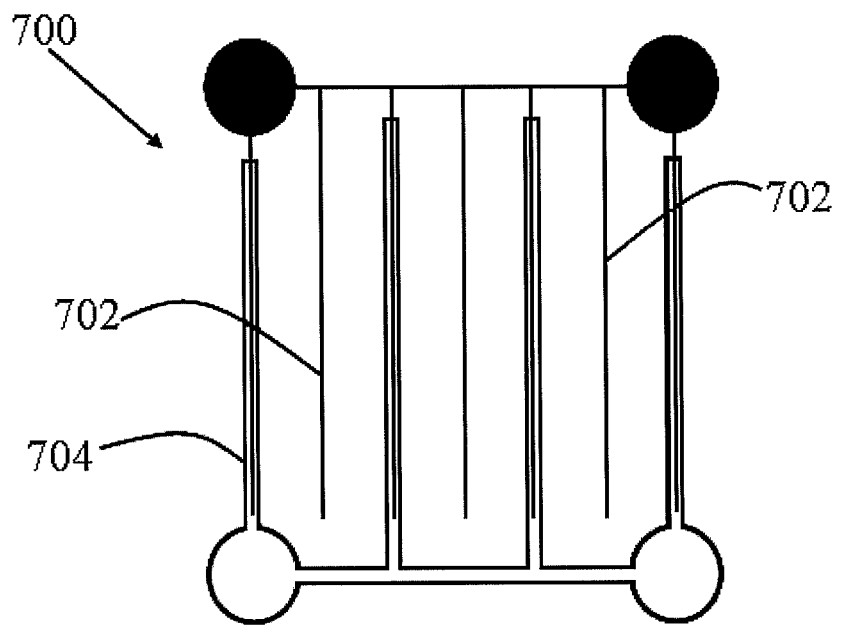
FIG. 7C illustrates a top view of the electrode structure of the optoelectronic semiconductor device in accordance with another form of the sixth embodiment of the present application.
Figure 7D:
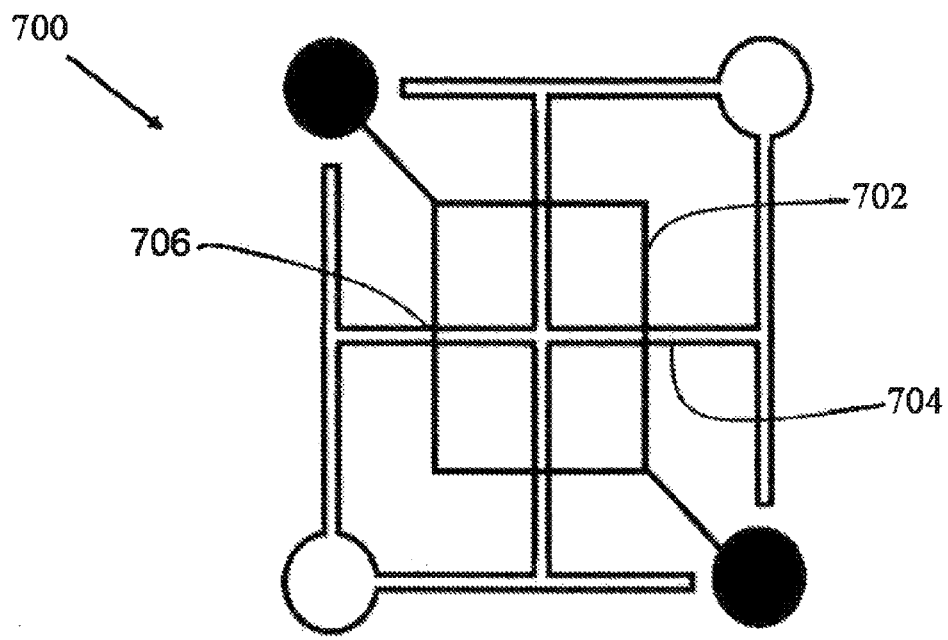
FIG. 7D illustrates a top view of the electrode structure of the optoelectronic semiconductor device in accordance with another form of the sixth embodiment of the present application.
Figure 7E:
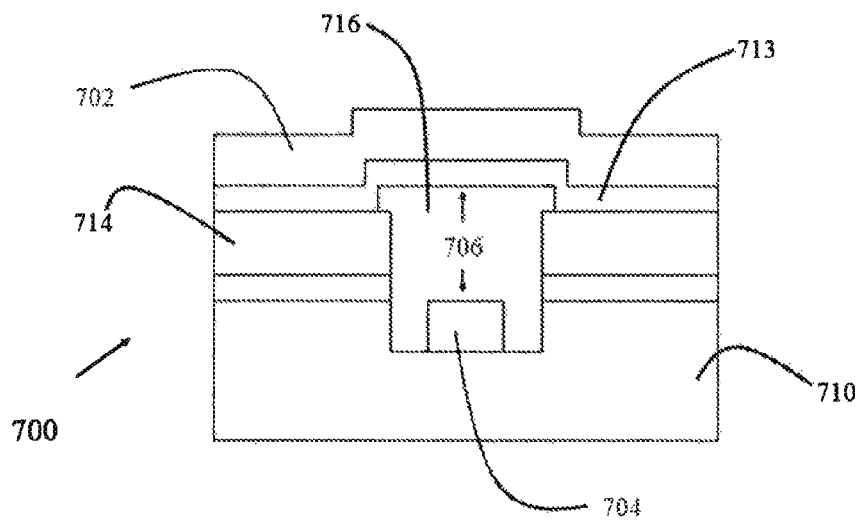
FIG. 7E illustrates a side view of the electrode structure of the optoelectronic semiconductor device in accordance with another form of the sixth embodiment of the present application.

Referring to FIG. 7C, the p-type extension electrode 702 can include more branches than that of the embodiment in FIG. 7A for enhancing the effect of current spreading, and the amount of the branches of the p-type extension electrode 702 can be more than that of the n-type extension electrode 704. Referring to FIGS. 7D and 7E, the n-type extension electrode 704 forms a crisscross pattern, and the p-type extension electrode 702 forms a rectangular pattern to intersect the crisscross portion of the n-type extension electrode 704 at four points in top view, and a plurality of crossovers 706 corresponding to the intersections between the p-type extension electrode 702 and the n-type extension electrode 704 are formed. The transparent conductive layer 713 is formed between the p-type extension electrode 702 and the insulating layer 716, and the p-type extension electrode 702 and the p-type semiconductor layer 714.

Figure 8:
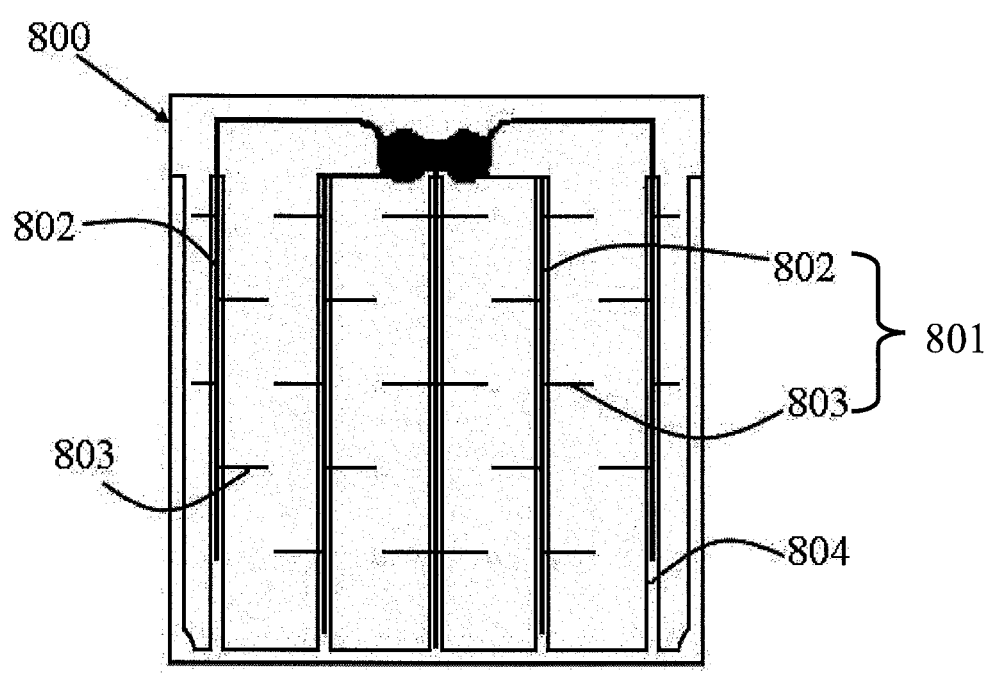
FIG. 8 illustrates a top view of the electrode structure of the optoelectronic semiconductor device in accordance with the seventh embodiment of the present application.

FIG. 8 illustrates a top view of the optoelectronic semiconductor device 800 in accordance with the seventh embodiment of the present application. The p-type extension electrode 801 includes a plurality of first branches 802 and a plurality of second branches 803 extended from the first branches 802, and the width of each of the second branches 803 is thinner than that of each of the first branches 802. From the top view of the optoelectronic semiconductor device 800, the p-type extension electrode 801 shows a nervure-like pattern for enhancing the effect of current spreading. The plurality of first branches 802 can overlap the n-type extension electrode 804 of the optoelectronic semiconductor device 800 to allow more light emitted from the inside of the optoelectronic semiconductor device 800. Furthermore, the n-type extension electrode 804 is covered by the aforementioned insulating layer and overlapped by the p-type extension electrode 801, so that the second branches 803 can be arranged more widely on the upper surface of the optoelectronic semiconductor device 800 for spreading the current.

The optoelectronic semiconductor device mentioned above may be mounted with the substrate side down onto a submount via a solder bump or a glue material to form a light-emitting apparatus. Besides, the submount further comprises at least one circuit electrode layout structure electrically connected to the electrode of the light-emitting device via an electrical conductive structure, such as a metal wire. The submount mentioned above can be a lead frame or a mounting substrate to make the circuit design easily and improve the heat dissipation.

Comparing to the prior art, the layout of the electrode structure of the application has more advantages such as: there is no need to keep the p-type extension electrode a certain distance from the n-type extension electrode. In this application, the second conductivity type extension electrode forms a semi-enclosed or closed pattern and the first conductivity type extension electrode is formed in the central region of the closed pattern to contact the surface of the second conductivity type layer by leaps. The layout of the electrode structure of this application is separated into several geometric symmetry subunits (semi-enclosed or closed patterns) and makes the current spread into the light emitting diode uniformly. Therefore, when the chip size of the light emitting diode is extensively increased, the electrode layout can be easily modified by increasing the subunits mentioned above.

Although the drawings and the illustrations above are corresponding to the specific embodiments individually, the elements, the practicing method, the designing principle, and the technical theory can be referred, exchanged, incorporated, collocated, coordinated except they conflict, are incompatible, or hard to put into practice together.

Although the present application has been explained above, the exemplary disclosure is not intended to limit the scope of the invention, the sequence in practice, the materials used in practice, or the method in practice. Any modification of the present application does not deviate from the spirit and the scope of the invention.

What is claimed is:

1. An optoelectronic semiconductor device comprising:
   a substrate;
   a semiconductor system formed on the substrate, the semiconductor system comprising:
      a first conductivity type layer;
      a second conductivity type layer; and
      an active layer formed between the first conductivity type layer and the second conductivity type layer;
   a recess structure formed to expose a portion of the first conductivity type layer being a bottom surface of the recess structure; and
   an electrode structure formed on the semiconductor system, wherein the electrode structure comprises:
      a first conductivity type bonding pad electrically connected to the first conductivity type layer;
      a second conductivity type bonding pad electrically connected to the second conductivity type layer;
      a first conductivity type extension electrode formed on the bottom surface and extending laterally in the recess structure;
      a second conductivity type extension electrode, wherein the first conductivity type extension electrode and the second conductivity type extension electrode form a three-dimensional crossover; and
      an insulating layer formed on the first conductivity type layer, the insulating layer covering the first conductivity type extension electrode in the recess structure and filling in the recess structure,
   wherein the first conductivity type extension electrode and the second conductivity type extension electrode are on opposite sides of the active layer.

2. The optoelectronic semiconductor device of claim 1, wherein the first conductivity type extension electrode is electrically connected to the first conductivity type bonding pad and the second conductivity type extension electrode is electrically connected to the second conductivity type bonding pad.

3. The optoelectronic semiconductor device of claim 1, wherein the first conductivity type extension electrode and the second conductivity type extension electrode include multiple branches respectively.

4. The optoelectronic semiconductor device of claim 3, wherein number of the branches of the second conductivity type extension electrode are more than a number of branches of the first conductivity type extension electrode.

5. The optoelectronic semiconductor device of claim 1, wherein the second conductivity type extension electrode comprises a plurality of first branches and a plurality of second branches extended from the first branches.

6. The optoelectronic semiconductor device of claim 5, wherein a width of each of the second branches is thinner than a width of each of the first branches.

7. The optoelectronic semiconductor device of claim 5, wherein the second conductivity type extension electrode comprises a nervure-like pattern.

8. The optoelectronic semiconductor device of claim 1, wherein the second conductivity type extension electrode is formed on the second conductivity type layer and electrically connected to the second conductivity type layer.

9. The optoelectronic semiconductor device of claim 1, wherein the insulating layer includes a portion composed of the three-dimensional crossover between the first conductivity type extension electrode and the second conductivity type extension electrode.

10. The optoelectronic semiconductor device of claim 1, further comprising a transparent conductive layer formed on the second conductivity type layer and the insulating layer, wherein the transparent conductive layer is above the insulating layer.

11. The optoelectronic semiconductor device of claim 10, wherein the transparent conductive layer is formed between the second conductivity type layer and the second conductivity type extension electrode.

12. The optoelectronic semiconductor device of claim 1, wherein the second conductivity type extension electrode overlaps the first conductivity type extension electrode.

13. The optoelectronic semiconductor device of claim 1, wherein the first conductivity type extension electrode forms a crisscross pattern, and the second conductivity type extension electrode forms a rectangular pattern to intersect the crisscross pattern of the first conductivity type extension electrode at a plurality of points in top view of the optoelectronic semiconductor device.

14. The optoelectronic semiconductor device of claim 1, wherein a material of the electrode structure contains one or more elements selected from the group consisting of Cr, Ti, Ni, Pt, Cu, Au, Al and Ag.

15. The optoelectronic semiconductor device of claim 1, wherein a material of the insulating layer are inorganic oxide or dielectric organic material containing one or more elements selected from the group consisting of SiOx, SiNx, Al2O3, TiOx.

16. The optoelectronic semiconductor device of claim 1, wherein a material of the semiconductor system contains one or more elements selected from the group consisting of Ga, Al, In, As, P, N and Si.

17. The optoelectronic semiconductor device of claim 1, wherein the semiconductor system comprises at least one of a light-emitting diode (LED), a laser diode (LD), a solar cell, a liquid crystal display, or an organic light-emitting diode.

* * * * *